United States Patent
Zimmermann et al.

(10) Patent No.: US 12,093,199 B2
(45) Date of Patent: *Sep. 17, 2024

(54) INFRASTRUCTURE MANAGEMENT DEVICE

(71) Applicant: ZPE Systems, Inc., Fremont, CA (US)

(72) Inventors: Arnaldo Zimmermann, Dublin, CA (US); Livio Ceci, Fremont, CA (US)

(73) Assignee: ZPE SYSTEMS, INC., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/902,264

(22) Filed: Jun. 16, 2020

(65) Prior Publication Data

US 2020/0311003 A1 Oct. 1, 2020

Related U.S. Application Data

(63) Continuation-in-part of application No. 15/640,609, filed on Jul. 3, 2017, now Pat. No. 10,721,120, which is a continuation-in-part of application No. 15/063,838, filed on Mar. 8, 2016, now Pat. No. 10,418,762.

(Continued)

(51) Int. Cl.
| | |
|---|---|
| *G06F 13/38* | (2006.01) |
| *G06F 1/26* | (2006.01) |
| *H04L 41/0869* | (2022.01) |
| *H04L 41/0893* | (2022.01) |
| *H04L 43/0817* | (2022.01) |
| *H05K 1/14* | (2006.01) |
| *H05K 7/14* | (2006.01) |

(52) U.S. Cl.
CPC ............ *G06F 13/385* (2013.01); *G06F 1/266* (2013.01); *H04L 41/0869* (2013.01); *H04L 41/0893* (2013.01); *H04L 43/0817* (2013.01); *H05K 1/147* (2013.01); *H05K 7/1429* (2013.01); *G06F 2213/0042* (2013.01)

(58) Field of Classification Search
CPC .................. G06F 13/385; G06F 1/266; G06F 2213/0042; H04L 41/0869; H04L 41/0893; H04L 43/0817; H05K 1/147; H05K 7/1429
See application file for complete search history.

(56) References Cited

U.S. PATENT DOCUMENTS

| | | | | |
|---|---|---|---|---|
| 6,219,803 B1 * | 4/2001 | Casella | ................. | H04L 67/565 |
| | | | | 726/12 |
| 6,798,872 B1 * | 9/2004 | Matsumoto | ........... | H04M 15/06 |
| | | | | 379/142.16 |

(Continued)

*Primary Examiner* — Ninos Donabed
(74) *Attorney, Agent, or Firm* — HORIZON IP PTE LTD.

(57) ABSTRACT

Described herein is an infrastructure management device. In accordance with one aspect, the infrastructure management device includes at least one communication interface to connect to and provide power to at least one information technology (IT) device, and communicate with at least one other infrastructure management device. The infrastructure management device may further include one or more processors and one or more non-transitory machine-readable media comprising instructions configured to cause at least one of the one or more processors to perform operations to manage the IT device.

19 Claims, 7 Drawing Sheets

Related U.S. Application Data

(60) Provisional application No. 62/358,144, filed on Jul. 4, 2016.

(56) References Cited

U.S. PATENT DOCUMENTS

| | | | |
|---|---|---|---|
| 6,805,560 B1 | 10/2004 | Budny et al. | |
| 6,924,986 B1 | 8/2005 | Sardella et al. | |
| 7,077,710 B2 | 7/2006 | Haggay et al. | |
| 7,220,145 B2 | 5/2007 | Denovich et al. | |
| 7,499,528 B2* | 3/2009 | Lee | H04M 3/42042 379/88.19 |
| 9,419,856 B1 | 8/2016 | Chawla et al. | |
| 2003/0051049 A1 | 3/2003 | Noy et al. | |
| 2004/0111505 A1 | 6/2004 | Callahan et al. | |
| 2004/0229501 A1 | 11/2004 | Caveney et al. | |
| 2005/0008146 A1* | 1/2005 | Chheda | H02J 1/10 379/413 |
| 2005/0065972 A1 | 3/2005 | Haines et al. | |
| 2005/0201073 A1 | 9/2005 | Pincu et al. | |
| 2006/0223343 A1 | 10/2006 | Campini et al. | |
| 2007/0014248 A1 | 1/2007 | Fowlow | |
| 2007/0124529 A1 | 5/2007 | Carr et al. | |
| 2007/0165618 A1 | 7/2007 | Niazi et al. | |
| 2007/0171921 A1* | 7/2007 | Wookey | H04L 63/10 707/E17.013 |
| 2009/0152216 A1 | 6/2009 | Champion et al. | |
| 2009/0178986 A1* | 7/2009 | Coglitore | H05K 7/1488 211/26 |
| 2009/0300394 A1* | 12/2009 | Archer | G06F 1/3287 713/320 |
| 2009/0307333 A1* | 12/2009 | Welingkar | H04L 67/1095 455/414.3 |
| 2010/0130233 A1* | 5/2010 | Parker | H04W 12/30 455/456.3 |
| 2011/0078346 A1 | 3/2011 | O'Connor et al. | |
| 2011/0126275 A1 | 5/2011 | Anderson et al. | |
| 2011/0238820 A1 | 9/2011 | Matsuoka | |
| 2012/0014384 A1 | 1/2012 | Diab et al. | |
| 2013/0107853 A1 | 5/2013 | Pettus et al. | |
| 2013/0124913 A1 | 5/2013 | Tamura et al. | |
| 2013/0238795 A1 | 9/2013 | Geffin et al. | |
| 2013/0273892 A1* | 10/2013 | Parker, II | H04M 1/72457 455/411 |
| 2015/0120652 A1 | 4/2015 | Dittrich et al. | |
| 2015/0154636 A1 | 6/2015 | Spitkovsky | |
| 2015/0172916 A1* | 6/2015 | Parker, II | H04W 8/22 455/411 |
| 2015/0277958 A1 | 10/2015 | Tanaka | |
| 2015/0317594 A1 | 11/2015 | Reznik et al. | |
| 2015/0326025 A1* | 11/2015 | Bell | H02J 50/40 307/104 |
| 2016/0025942 A1 | 1/2016 | Pepe et al. | |
| 2016/0055184 A1 | 2/2016 | Fokoue-nkoutche et al. | |
| 2016/0066255 A1 | 3/2016 | Marinier et al. | |
| 2016/0162701 A1 | 6/2016 | Rosenberg | |
| 2016/0224279 A1* | 8/2016 | Kim | G06F 3/1229 |
| 2017/0086332 A1 | 3/2017 | Jaskela et al. | |
| 2018/0255446 A1* | 9/2018 | Reunamaki | H04W 76/11 |

* cited by examiner

INFRASTRUCTURE MANAGEMENT DEVICE

CROSS-REFERENCE TO RELATED APPLICATIONS

The present application is a continuation-in-part of prior U.S. application Ser. No. 15/640,609 filed Jul. 3, 2017, which is a continuation-in-part of prior U.S. application Ser. No. 15/063,838 filed Mar. 8, 2016, and also claims the benefit of U.S. provisional application No. 62/358,144 filed Jul. 4, 2016, which are all hereby incorporated by reference in their entirety.

BACKGROUND

The high concentration of Information Technology (IT) devices in data centers typically require expensive physical space and overhead in powering, configuring, tracking, clustering, monitoring and managing IT device states. Additionally, different IT devices, such as those provided by various vendors, may have different communication interfaces, network protocols, user interfaces and application programming interfaces (APIs), which increase the difficulty of communicating with the IT devices.

SUMMARY

Described herein is an infrastructure management device. In accordance with one aspect, the infrastructure management device includes at least one communication interface to connect to and provide power to at least one information technology (IT) device, and communicate with at least one other infrastructure management device. The infrastructure management device may further include one or more processors and one or more non-transitory machine-readable media comprising instructions configured to cause at least one of the one or more processors to perform operations to manage the IT device.

BRIEF DESCRIPTION OF DRAWINGS

Some implementations are illustrated in the accompanying figures, in which like reference numerals designate like parts, and wherein.

DETAILED DESCRIPTION

Figure 1:
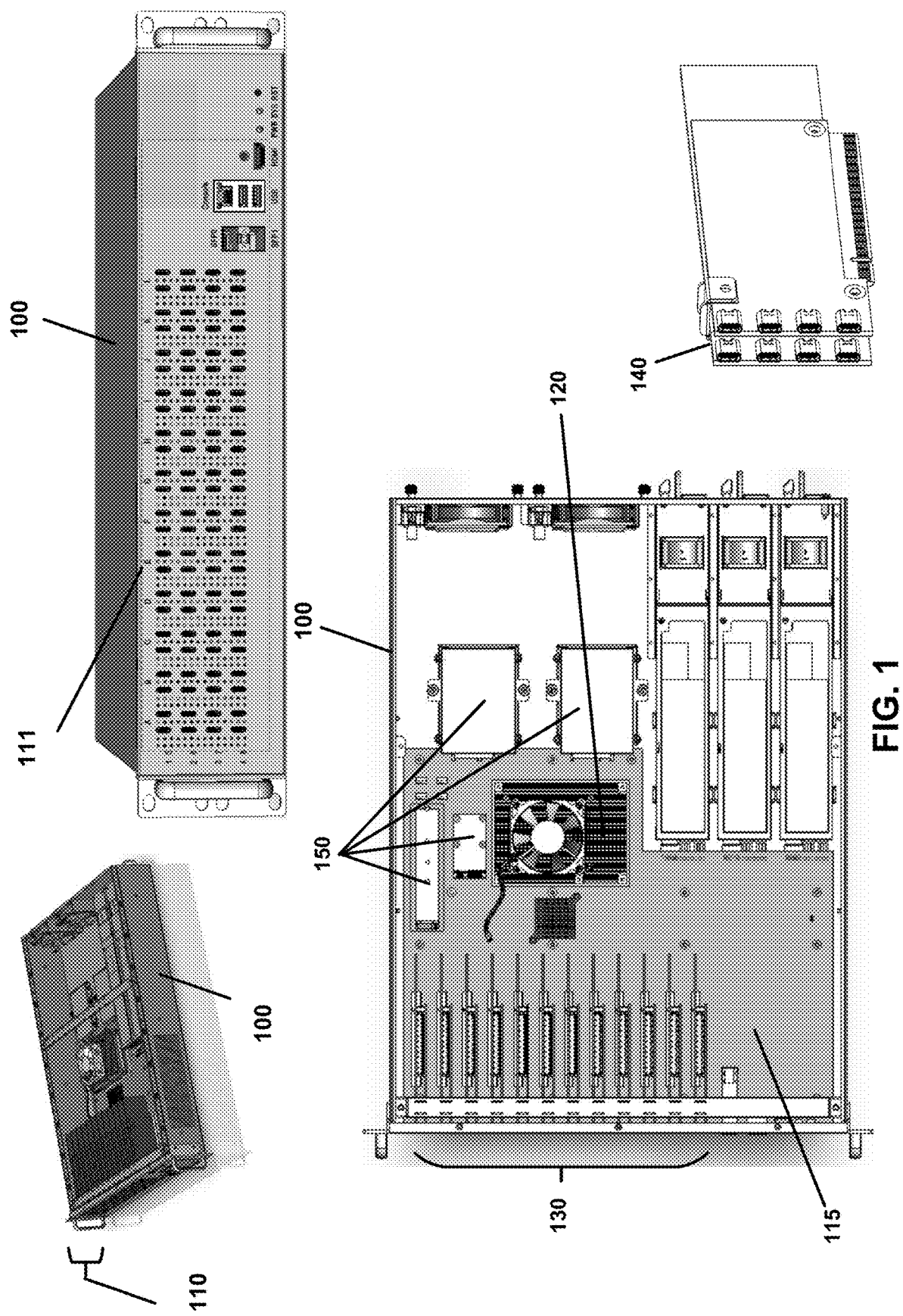
FIG. 1 show different views of an exemplary infrastructure management (IM) device.

In the following description, for purposes of explanation, specific numbers, materials and configurations are set forth in order to provide a thorough understanding of the present frameworks and methods and in order to meet statutory written description, enablement, and best-mode requirements. However, it will be apparent to one skilled in the art that the present frameworks and methods may be practiced without the specific exemplary details. In other instances, well-known features are omitted or simplified to clarify the description of the exemplary implementations of the present framework and methods, and to thereby better explain the present framework and methods. Furthermore, for ease of understanding, certain method steps are delineated as separate steps, however, these separately delineated steps should not be construed as necessarily order dependent in their performance.

A "device" as used herein is a machine and/or component that may attach to a computer and/or computer network. Examples of devices include disk drives, printers, displays, mice, modems, other input, output and/or storage devices. These devices may fall into a category of peripheral devices that separate from a main computing device. Many devices, whether peripheral or not, may employ a program called a device driver that may act as a translator, converting general commands from an application into specific commands that the device understands.

An "IT device" is an "Information Technology" device related to computing technology, comprising, but not limited to, data center devices, mobile devices, networking devices, hardware devices, software operating in combination with a hardware IT device, Internet devices, and/or the like. Some IT devices may employ virtual devices operating on specially configured hardware. Additional examples of IT devices include servers, compute nodes, routers, switches, firewalls, load balancers, networking nodes, storage nodes, power nodes, cooling nodes, storage appliances, power appliances, cooling appliances, network appliances, virtual appliances, virtual machines, system hardware with network access, hosted module within a system, laptop, USB device, cellular phone, tablet device, mobile device, environment sensor device, video or screen or monitor device, keyboard device, combinations thereof, and/or the like.

A "virtual device" may employ a software virtual device driver operating on a hardware computing device configured to emulate hardware and/or other devices so that multiple applications may, for example, access hardware interrupt channels, hardware resources, and memory without causing conflicts. Computer hardware may require communication and control processes for devices and/or hardware components to access each other in a controlled manner. These processes may be defined as device drivers, which may comprise code that an application may employ to access hardware and/or external software resources. Some virtual devices may be configured for use in multitasking operating systems. For example, a device driver may be controlled by an operating system's virtual device driver manager and shared by applications running within that kernel. A virtual device driver may pass interrupt and memory requests through the kernel, which in turn may allocate resources as required.

An "agent" may comprise a computer program that acts for a user or other program in a relationship of agency, which derives from the Latin agere (to do): an agreement to act on one's behalf. Such "action on behalf of" implies the authority to decide which, if any, action is appropriate. Some agents may comprise, but are not limited to: intelligent agents (in particular, exhibiting some aspect of artificial intelligence, such as learning and reasoning), autonomous agents (capable of modifying the way in which the agent achieves objectives), distributed agents (being executed on physically distinct computers), multi-agent systems (distributed agents that do not have the capabilities to achieve an objective alone and thus must communicate), mobile agents (agents that can relocate their execution onto different processors), and/or the like.

An infrastructure management device is described herein. In accordance with some implementations, the infrastructure management device provides power and/or network communication data to one or more physical IT devices and/or virtual devices. Such devices may include data center, network, test and/or laboratory components, including but not limited to, compute nodes, mobile nodes, networking nodes, storage nodes, power nodes, cooling nodes, combinations thereof, and/or the like. The infrastructure management device may employ IT device information to determine an action to be performed on the devices. The nature of the interaction between the infrastructure management device and other devices may be regulated by the type of device. The device type may dictate the network protocols natively supported by the IT devices. The device type may also be used to identify a class or type of action that may apply for devices available in a network.

Exemplary implementations of the infrastructure management (IM) device enable configuration, discovery, clustering and/or searching of other devices (e.g., IT and/or IM devices) connected via a communication interface of the infrastructure management device. Device information may be indexed and stored in a device index. The infrastructure management device may perform actions on one or more devices. Such action may be determined at least in part by device information extracted from the device index. By enabling configuration, discovery, clustering and/or searching of connected devices from the IM device, such connected devices may advantageously be shared and remotely accessed by different teams in different locations. For example, teams in different offices around the world may collaborate and/or share and re-use devices (e.g., test devices) connected to the IM device, thereby enhancing efficiency and saving time, money and other resources. Virtual machines for different devices may also be provided as a service on a cloud.

Furthermore, the infrastructure management device advantageously combines server, storage and power capabilities in a single high-density appliance with a small form factor (e.g., 2 Rack-Unit or less) to save rack space, simplify configuration and reduce management overhead. The infrastructure management system may provide continuous power, access and control to many different types of devices via powered ports (e.g., type C USB port). Due to the availability of power, the connected devices do not require any additional power source or battery, thereby saving physical space as well as other resources.

With the combination of server, storage and power capabilities in one compact appliance, the infrastructure management device may be used in many applications that require connection to and management of a multitude of IT devices. For example, the infrastructure management device may be used to interface with test IT devices during software development. One or more test IT devices (e.g., mobile devices such as tablets or smartphones) may be connected to the infrastructure management device. The infrastructure management device may then be used to debug, update and/or test software applications (e.g., Apps) on the IT devices. Logs of the test results may be stored on the infrastructure management device. Different versions of the software may also be stored on the infrastructure management device. In some implementations, infrastructure management device monitors and controls power delivery to the connected test IT devices so as to avoid damage to the batteries of the test IT devices during software development.

In another exemplary application, the infrastructure management device may be used during production of IT devices. More particularly, the infrastructure management device connects directly to the IT devices to perform, for example, initial configuration, collection of test logs, etc. This is particularly useful when there is no communication network available that the IT devices can be connected to. These and other exemplary features and advantages will be described herein.

FIG. 1 shows different views of an exemplary infrastructure management device 100. The height 110 of the housing may be two Rack-Unit (2 U), one Rack-Unit (1 U) or less than one Rack-Unit (<1 U) while the housing is mounted horizontally to the rack, or zero Rack-Unit (0 U) while the housing is mounted vertically to the rack. A rack unit (U) is a unit of measure and may be defined as 1.75 inches (44.45 mm).

The housing of the infrastructure management device 100 may be configured to enclose at least one communication interface 111, one or more processors and one or more non-transitory machine-readable media 150. The communication interface 111 may include at least one of the following: a USB port, a serial port, an RS-232 serial, an RS-485 serial, a Local Area Network (LAN), a Wide Area Network Area (WAN), a Virtual Private Network (VPN), a Wi-Fi wireless Network, a Bluetooth, a combination thereof and/or the like. The communication interface 111 may also include, for example, a high number of USB ports distributed on any one side of the housing according to the space availability. The USB ports may be type A, type C, or a combination thereof. As shown, the exemplary communication interface 111 comprises a total of 96 USB ports arranged in 4 rows. Other configurations are also possible.

The infrastructure management device 100 may further include a carrier input/output (I/O) board 115 to hold the central processing unit (CPU) board 120, the I/O interface 130, storage 150 and additional peripheral controllers related to the I/O interface 130. CPU board 120 may include processors, system memory and/or common peripherals. The I/O interface 130 may include at least one I/O interface module 140. The I/O interface module 140 may be configured to perform a logical mapping between I/O signals from the carrier I/O board 115 and the communication interface 111. Exemplary sources of I/O signals being mapped may include: a null-modem serial port, a data communications equipment (DCE) serial port, a data terminal equipment (DTE) serial port, a Cisco pinout serial port, a Cyclades pinout serial port, a straight-through serial port, a cross-over serial port, a rolled RJ45 port, an RS-232 serial, an RS-485 serial, a Local Area Network (LAN), a Wide Area Network Area (WAN), a Virtual Private Network (VPN), a Wi-Fi wireless Network, a USB port, a type A USB port, a type C USB port, a Bluetooth, a combination of the above and/or the like.

The I/O interface module 140 may also provide power by one or more of the following methods: providing electrical power over USB interface (e.g., type A and/or type C USB interface), providing switchable ON/OFF electrical power over USB interface, metering electrical power over USB interface, metering electrical power over USB interface, providing electrical power over ETHERNET interface, switchable ON/OFF electrical power over ETHERNET interface, metering electrical power over ETHERNET interface, and/or metering electrical power over ETHERNET interface.

Figure 2:
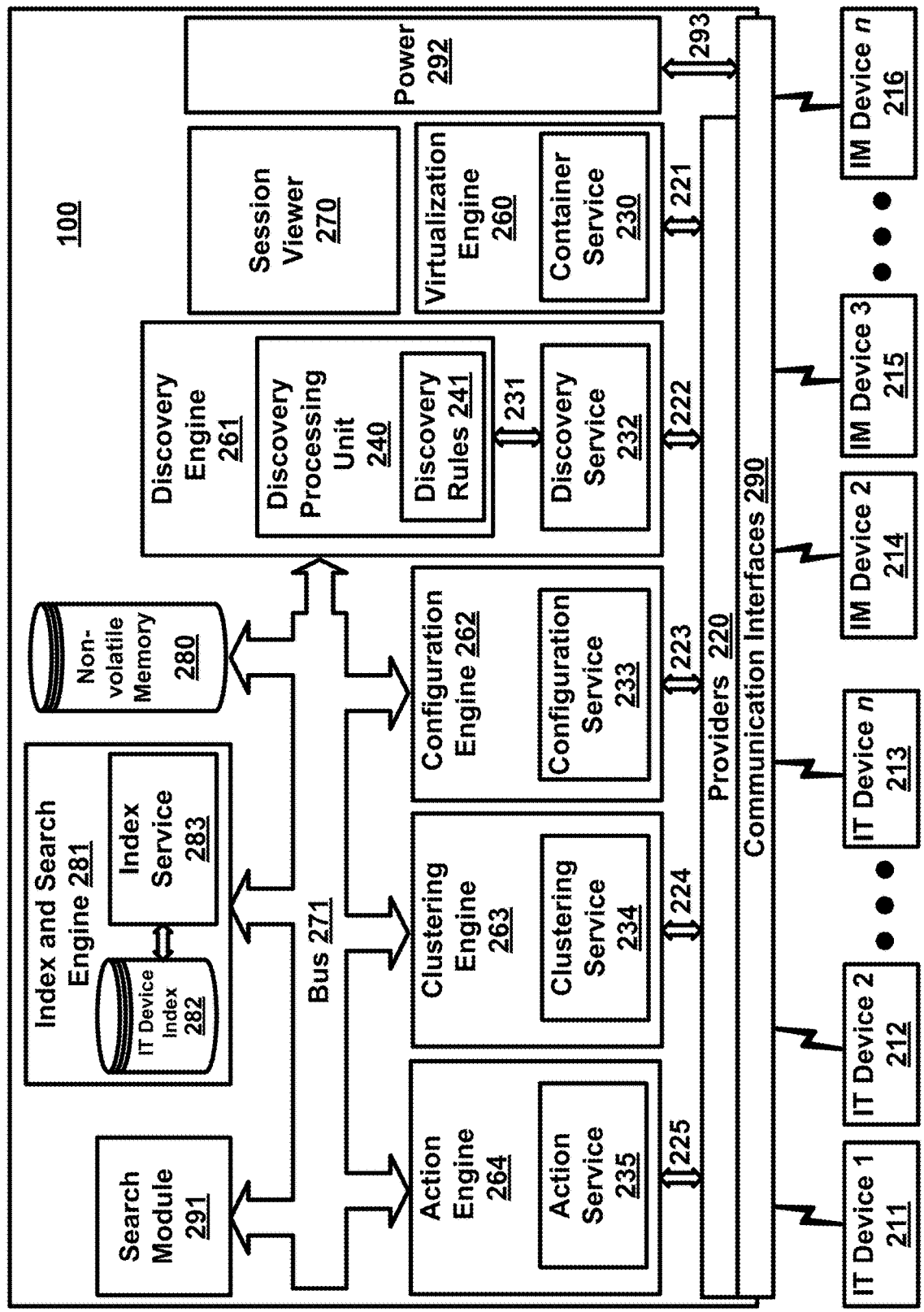
FIG. 2 is a schematic diagram of an exemplary infrastructure management (IM) device.

FIG. 2 is a schematic diagram of an exemplary infrastructure management (IM) device 100. Exemplary IM device 100 may include components to power, configure, discover, cluster, index, exchange index table, search and/or take action on at least one IT device in a data center. The infrastructure management device 100 may interact with IT devices 211, 212, . . . , 213 and/or with additional Infrastructure Management (IM) devices 214, 215, . . . , 216 via one or more communication interfaces 290.

The IM devices 214, 215, . . . , 216 may include components similar to exemplary IM device 100. For example, each of the IM devices 100, 214, 215, . . . , 216 may include a housing, at least one USB port interface, and at least one of the following: system hardware with network access, a server, a compute node, a router, a switch, a firewall, a load balancer, a networking node, a storage node, a power node, a network appliance, a virtual appliance, a hosted module within a system, a combination thereof, and/or the like.

Each of the IT devices 211, 212, . . . , 213 may be implemented as, for example, a server, a compute node, a router, a switch, a firewall, a load balancer, a networking node, a storage node, a power node, a cooling node, a storage appliance, a power appliance, a cooling appliance, a network appliance, a virtual appliance, a virtual machine, system hardware with network access, a hosted module within a system, a laptop, a USB device, a cellular phone, a tablet device, a mobile device, an environmental sensor device, a video or screen or monitor device, a keyboard device, a combination thereof, and/or the like.

Providers (or device drivers) 220 may include modules configured to understand the communication protocols capabilities of the IT devices 211, 212, . . . , 213 and/or the IM devices 214, 215, . . . , 216, and may employ these capabilities to interact with such devices via the communication interfaces 290. The communication interfaces 290 may include one or more of the following: a serial port, an RS-232 serial, an RS-485 serial, a Local Area Network (LAN), a Wide Area Network Area (WAN), a Virtual Private Network (VPN), a Wi-Fi wireless Network, a USB port, a USB port type A, a USB port type C, a Bluetooth, a combination of the above and/or the like. The providers 220 may also interact with virtualization engine 260, discovery engine 261, configuration engine 262, clustering engine 263 and/or action engine 264 on IM device 100. Providers 220 and engine modules 260, 261, 262, 263 and/or 264 may interact via provider interfaces 221, 222, 223, 224 and/or 225 respectively.

Configuration engine 262 may provide an interface to configure and/or manage IM device 100 via configuration service 233. The interface may comprise a user interface available via, for example, a command line interface (CLI), a web interface, programmatically via an application programmable interface (API), a combination thereof, and/or the like. The interface may receive configuration data to configure and/or manage IM device 100. Such configuration data may be stored in, for example, non-volatile memory 280, and include IT device information, discovery enablement information, clustering enablement information, a combination thereof, and/or the like.

IT device information may include at least one of the following: a universally unique identifier, a virtual machine name, a hypervisor internet protocol (IP) address, an alias IP address, a group/community identifier, a port identifier, a port range identifier, a USB port range, a USB port identifier, a USB port name, an IT device name, a power status, a power parameter, a power feed, an action, a list of actions, a command, a hostname, an icon, an internet protocol address, a protocol type, a service processor type, a media access control address (MAC address), a hierarchical organization, a connection status, a configuration parameter, a user defined field and value, a map address location, a group of IT device parameters, a group of users' parameters, an IT device access rights parameter, a notification parameter, a data logging parameter, an alert parameter, an IT device initial status, an application information, an application location, an application status, an application icon, an application file, a data store and a keyboard, video and mouse information, a combination thereof, and/or the like. Discovery enablement information may include at least one of the following: a configuration parameter, a multitude of parameters, an action, a multitude of actions, and an IT device state. The clustering enablement information device may comprise at least one of the following: a configuration parameter, a multitude of parameters, an action, a multitude of actions, an IT device state, a combination thereof, and/or the like. Configuration engine 262 may be connected, for example, via a bus 271 to a non-volatile memory 280 in order to store, read and/or update the configuration information required by the system. The non-volatile memory 280 may include an in-memory data store, an on-disk data store, a local data store, a remote data store, a distributed data store, a replicated data store, a combination of the above, a combination thereof, and/or the like.

In accordance with some implementations, discovery engine 261 may be employed for discovering IT devices 211, 212, . . . , 213 connected to the IM device 100 via communication interfaces 290. IT devices 211, 212, . . . , 213 may request connection and/or configuration via communication interfaces 290 once they are powered on and/or from time to time (e.g., a periodic basis). Discovery engine 261 may include a discovery processing unit 240 and a discovery service 232. Discovery service 232 may serve to collect identification information from IT devices 211, 212, . . . , 213. Alternatively, discovery service 232 may also discover the IT device identification by polling for information from time to time (e.g., on a periodic basis). For example, polled IT devices may also include a concentrator of additional child IT devices and the information collected from the polled IT devices may contain a collection of IT device identification information from the child IT devices. This mechanism may facilitate a bulk discovery process. For example, a USB hub, a console server or IT devices from multiple vendors may provide information of IT devices connected via their USB or serial ports. Similarly, a virtual machine (VM) hypervisor may provide information on virtual machines running on that system. Examples of IT device identification information may include, but are not limited to: universally unique identifier (UUID), VIVI name, group/community information, IP address, media access control address (MAC address), hostname, serial port range, Keyboard-Video-Mouse (KVM) port range, blade identifier, combinations thereof, and/or the like.

Discovery processing unit 240 receives IT device identification information sent via a bus 231, and evaluates such information against discovery rules 241. Discovery rules 241 may employ a predetermined combination of logical operators (e.g., AND/OR) and parameters that are to be matched with the IT device identification information. An example of a discovery rule involves a partial physical media access control address (MAC address) inspection with an associated action to clone from an existing server when a match is found. A match may be found whenever a physical MAC address of an IT device requesting connection starts with the same first few (e.g., first 3) octets defined by this rule. In this case, the Personality Identification of the IT device may be used to find an existing IT device (clone from) already registered in the device inventory in order to ADD the newly discovered IT device under the same (or similar) category that may include, but is not limited to, configuration, authorization, authentication, access control, access rights, management options, group names and/or other relevant parameters. This may allow system administrators to maintain consistency on groups of IT devices alike, without having to spend unnecessary time and resources. If the matching IT device already exists in the IT Device index, then the Personality Identification may be used to UPDATE the information about the IT device in the IT Device Index. A conflict resolution may be invoked to address possible exceptions. Likewise, a discovery rule may be created to DENY the connection request from the IT device. This may be particularly useful in order to support multiple discovery systems in the same network, where other systems may have complementary rules and more.

Matching criteria may be based on partial parameters and/or full parameters inspected against the IT device identification information. A discovery action, such as but not limited to, an update of existing IT device, an addition of new IT device, a combination thereof, and/or the like, may be taken in combination with, for example, upon a successful match between one or more of the discovery rules 241 and IT device identification information. Examples of discovery actions initiated via the bus 231 include, but are not limited to: clone configuration data from an existing IT device, update configuration data if an IT device already exists and if changes are required, deny clone, which means no response may be given to the IT device from the system (this allows support of multiple discovery systems in the same network), a combination thereof, and/or the like. A discovery action may also get information from a non-volatile memory 280 via the bus 271 in order to perform a discovery service 232. Additionally, the non-volatile memory 280 may store, for example, IT device data for a newly added IT device, changes or updates on existing IT devices, information on existing IT devices that may be used on cloning process or discovery process, combinations thereof, and/or the like.

According to various implementations, index and search engine 281 may employ index service 283 to index IT device information that may be retrieved from the non-volatile memory 280 via bus 271. The indexing is stored in non-volatile IT device index 282. Index service 283 may perform indexing by: collecting, periodically, at least one IT device information for at least one of the at least one IT device from the IM device; processing, periodically, at least one IT device information for at least one of the at least one IT device from the IM device; organizing, periodically, at least one IT device information for at least one of the at least one IT device from the IM device; updating, periodically, the IT device index 282 of the IM device; a combination thereof, and/or the like. IT device index 282 may include at least one of the following: an in-memory data store, an on-disk data store, a local data store, a remote data store, a distributed data store, a replicated data store, a combination of the above, and/or the like.

According to some implementations, clustering engine 263 may employ clustering service 234 to cluster the IM device 100 with at least one other IM device 214, 215, . . . , 216 when enabled by clustering enablement information. The clustering service 234 may perform operations including at least one of the following: configuring one of the clustered IM devices to name and maintain a list of communicatively connected IM devices; configuring one of the clustered IM devices to define at least one credential for communicatively connected IM devices on at least one named list; configuring one of the clustered IM devices to define at least one SSL (Secure Sockets Layer) certificate for the clustered communicatively connected IM devices on at least one named list; configuring one of the clustered IM devices to request a list of the clustered communicatively connected IM devices on at least one named list; configuring one of the clustered IM devices to periodically interact with at least one of the clustered communicatively connected IM devices on at least one named list; providing information of at least one IT device to the clustered communicatively connected IM devices on at least one named list; exchanging at least one IT device index 282 of the clustered communicatively connected IM devices on at least one named list; a combination thereof, and/or the like.

According to various implementations, search module 291 may search IT device index 282 via the bus 271 for IT device information based on a search criterion. The searching may include conducting a natural language search. The search results may be represented in one or more forms, such as a table, a Web page, a hierarchical tree, a graphical node, a geographic map, a command-line (CLI), a combination thereof, and/or the like. The search criterion may be defined by at least one of the following: a query parameter, a source document index, a source field, a number of matching results to return, a sorting order, a Boolean logic, a filter, a range, a logical condition, an aggregation, a relevance, a combination of the above, and/or the like.

According to various implementations, action engine 264 may employ the action service 235 to, for example, execute at least one user-defined command, script or program on at least one IT device over a communication interface or locally. The action service 235 may also execute at least one user-defined command, script or program on at least one other IM device over the network or locally. Additionally, the action service 235 may initiate a serial console connection (e.g., serial virtual machine console), SOL (Serial-Over-Lan) console connection, screen-cast connection, a mirroring connection, an IT device access connection, a mapped file system connection, console shell connection, a video connection, a file transfer connection, a Keyboard-Video-Mouse (KVM) console connection, and/or a Mouse-Keyboard-Screen (MKS) virtual machine console connection over a communication interface. The action service 235 may further perform an application installation and/or removal, a software upgrade procedure, a configuration save and/or restore, a reboot over a communication interface, a power command on at least one IT device over a communication interface, establishment of a TCP/IP (Transmission Control Protocol/Internet Protocol) tunnel between the user's workstation and the IM device, access rights control on commands, data log collection on an IT device data session, data points collection on an IT device, data monitoring collection on an IT device, alert and notification based on configuration and data log collection from at least one of the at least one IT device, authentication and authorization to a user based on at least one of the following: command, user group and IT device, a combination thereof, and/or the like.

With respect to an action performed by action service 235, for example, a pre-defined command like "power off" may be executed as part of a set of actions initiated by a system administrator accessing an IM device in response to an IT device search result based on a search criterion applied to the IT device index 282. Since the IT device index 282 from a single clustered IM device may have been previously exchanged by the clustering service 234, the search may be performed over a local copy of the IT device index 282 and cover multiple clustered IM devices. Providers 220 and communication interfaces 290 may enable communication with the IT device in order to carry out the execution of the command "power off" on the IT device regardless of the IT device type enrolled in the IM device. In another example, the IT device may report a firmware version state like "firmware version 1.2", which may require a complex set of actions performed by a user-defined command such as "firmware upgrade" implemented via a custom script residing on one or more of the IT devices in the network. The custom script may make use of abstraction provided by providers 220 and communication interfaces 290 in order to carry out multiple actions such as, for example, upgrading firmware on the IT device followed by a "power reboot."

In some implementations, the virtualization engine 260 may employ container service 230 which may host, configure and manage virtualized processes and environments on the infrastructure management device. Examples of virtualized processes and environments may include, but are not limited to: dockerized applications, docker hypervisor, docker containers, virtual machine hypervisors, kernel-based virtual machines, virtual applications, virtual machines, virtual appliances, storage hypervisors, platform virtualization software, data mining applications, data collector applications, dash board applications, report applications, combinations thereof, and/or the like. For example, a standard dockerized splunk application could be hosted, configured, managed and executed by virtualization engine 260 and may crunch data available on the IM device in order to provide visualization of information.

Also illustrated in FIG. 2 and according to some implementations, session viewer 270 may provide an HTML5 proxy viewer or an X11 forwarding viewer of the native user interface of at least one of the IT devices 211, 212, . . . , 213 connected to IM device 100. This process may provide a means to interact with an IT device User Interface (UI), without requiring additional applications to be installed on an end user's workstation and/or without requiring direct communication between an end user's workstation and an IT device. For example, a HTML5 proxy or an X11 forwarding for a native user interface may include: a console viewer, a remote console viewer, a remote Secure Shell (SSH) viewer, a TELNET view, a Keyboard-Video-Mouse (KVM) viewer, a virtual KVM viewer, a Mouse-Keyboard-Screen (MKS) viewer, a virtual MKS viewer, a Remote-Desktop-Protocol (RDP) viewer, a Virtual-Network-Computing (VNC) viewer, and a WEB viewer. Additionally, a user accessing the IM device 100 may launch a MKS viewer to an IT Device that actually is a virtual machine running on a VMware EXSi server, without requiring direct network access to the virtual machine itself. When the MKS viewer is requested by the user, the IM device 100 may start an authorized and authenticated session with the virtual machine using a VMware application installed directly on the IM device 100 and the MKS viewer may forward the mouse, keyboard and screen interactions to a HTML 5 JavaScript running on a user's workstation browser. In this example, no application may be installed on the user's workstation and the HTML 5 JavaScript may be rendered directly from the IM device 100 to the user's browser offering the same user experience on different browser applications, workstations, mobile devices, combinations thereof, and/or the like.

Also illustrated in FIG. 2 and according to some implementations, power unit 292 may provide power charge via a bus 293 to IT devices connected to communication interfaces 290. Power may be provided over various types of interfaces, including but not limited to, USB interface (e.g., type A and/or C), switchable ON/OFF electrical power USB interface, ETHERNET interface, switchable ON/OFF electrical power ETHERNET interface. Electrical power or electrical current may also be metered over the USB interface and/or ETHERNET interface. Advantageously, an IT device connected to the communication interface 293 does not require an external or additional power source. Furthermore, some IT devices (e.g., mobile devices) may not even require use of a battery, since power is provided by the communication interface 293 (e.g., USB port). Additional control of power delivery to the connected IT device may be provided, including but not limited to, full hardware reboot, cold reboot, warm reboot, and/or measurement of power characteristics (e.g., current, voltage, power). Power characteristics of software applications running on the connected IT device may also be measured. In addition, the power delivery may be controlled to optimize the battery life of the connected IT device. For example, power delivery may be controlled to maintain a partial charge level on the connected IT device. The partial charge level may be set at, for example, 40-80% of the full charge.

Figure 3:
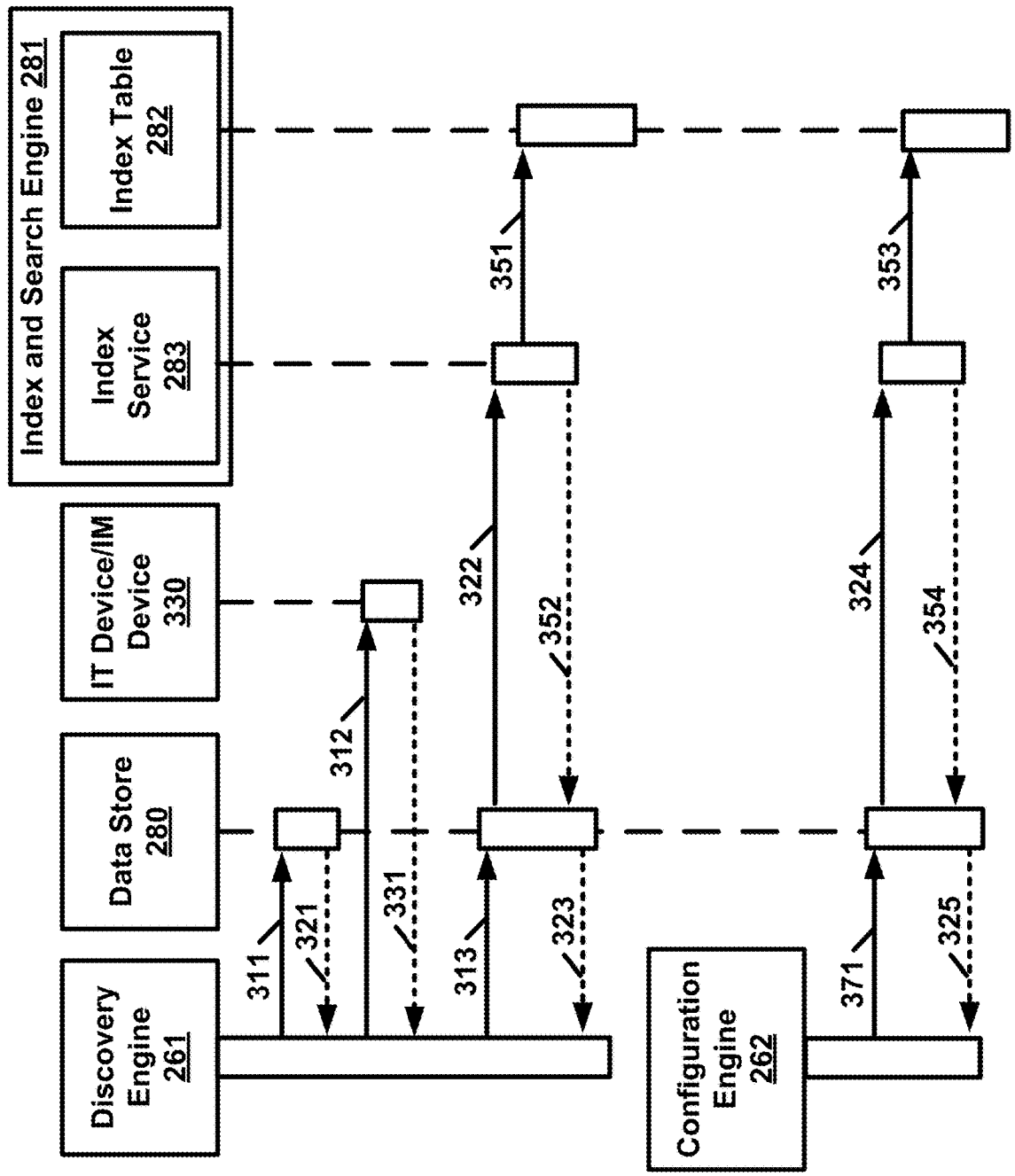
FIG. 3 is a flow diagram illustrating an exemplary technique for discovering and/or configuring an IT or IM device communicating with the infrastructure management device.

FIG. 3 is a flow diagram illustrating an exemplary technique for discovering and/or configuring an IT or IM device communicating with the infrastructure management device. The discovery engine 261 may request, via 311, configuration information from the non-volatile data store 280. A typical response may comprise information about the discovery rules and discovery service, which may be provided by the data store 280 to the discovery engine 261 via 321. Discovery engine 261 may employ this information to initiate an interaction with the IT device/IM device 330 via 312. Discovery engine 261 may also wait for an interaction initiated by the IT device/IM device 330 via 331. Discovery engine 261 may discover a new IT device/IM device 330 and/or may discover new (or updated) information about an existing IT device/IM device 330. The new device information and/or updated information may be sent to the data store 280 via 313, and the data store may reply to the discovery engine 261 with a notification status via 323. The communication via 313 may be executed in bulk and/or batches. The information entered into the data store 280 may trigger via 322 a call to the index service 283 within the index and search engine 281, which may cause an update via 351 to an index table 282. Once all the information is processed by the index service 283, it may send a notification status via 352 to the data store 280.

In another independent flow, configuration engine 262 may send, via 371, configuration information to data store 280 and the data store may reply to the configuration engine 262 with a notification status via 325. The communication via 371 may be executed in bulk and/or batches. The information entered into data store 280 may trigger, via 324, a call to an index service 283 within an index and search engine 281, which may cause an update via 353 to an index table 282. Once information is processed by the index service 283, the index service 283 may send a notification status via 354 to the data store 280.

Figure 4:
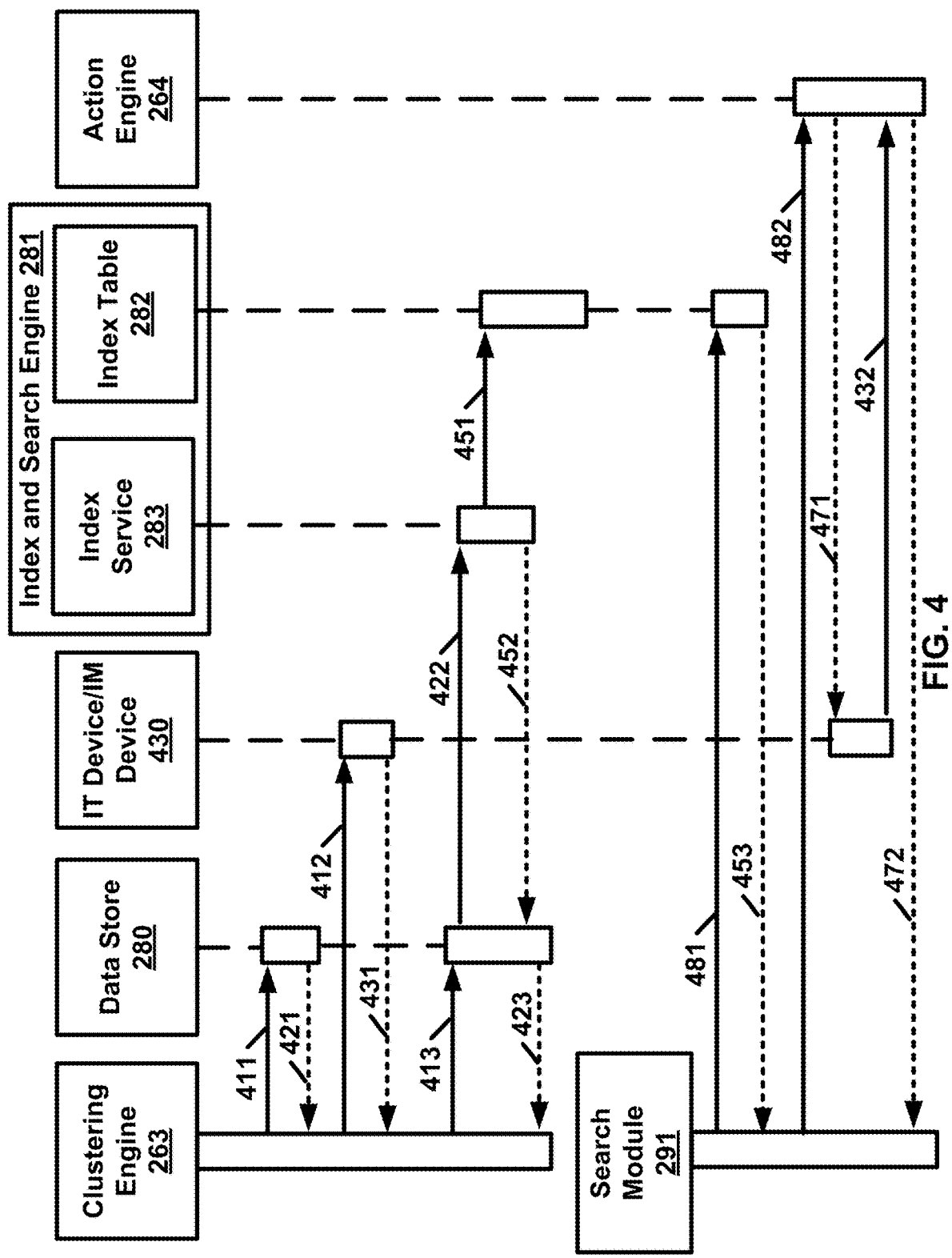
FIG. 4 is a flow diagram illustrating an exemplary technique for clustering and/or searching for an IT or IM device communicating with the infrastructure management device.

FIG. 4 is a flow diagram illustrating an exemplary technique for clustering and/or searching for an IT or IM device communicating with the infrastructure management device. Clustering engine 263 may request, via 411, configuration information from a non-volatile data store 280. A typical response may comprise information about this and other infrastructure management devices which may be configured to connect to the common secured cluster community via a communication interface. The configuration information may be provided by the data store 280 to a clustering engine 263 via 421. The clustering engine 263 may employ this information via 412 to initiate a new clustering connection and/or keep a periodic interaction with at least one IT device/IM device 430. Response 431 may be used to track the status and/or information of the clustering connection. This status/information of the clustering connection may be sent, via 413, to the data store 280 and may be stored for future reference. The data store 280 may reply with a notification status via 423.

The information entered into the data store 280 may trigger, via 422, a call to an index service 283 within an index and search engine 281, which may cause an update, via 451, to an index table 282. Once the information has been processed by an index service 283, the index service 283 may send a notification status, via 452, to the data store 280. Alternatively, the clustering engine 263 may share its local IT device index information, via 412, with other IT Device or IM Device 430 that may be part of the clustering connection. Other infrastructure management devices may send their individual IT device index information, via 431, so that each infrastructure management device may have local access to IT device index information of each other.

In another independent flow in FIG. 4, a search module 291 may send search requests 481 to the index table 282 within the index and search engine 281. Such search requests may use natural language search queries and/or other query formats and criteria. The search queries may be performed over locally available IT device index table 282. Search results 453 may be provided to the search module 291. Search module 291 may employ the search result to request one or multiple actions 482 to an action engine 264. The action commands 471 may be performed over IT device/IM device 430 and their action results 432 may be sent to the action engine 264. The action engine 264 may also report the action results 472 back to the search module 291.

Figure 5:
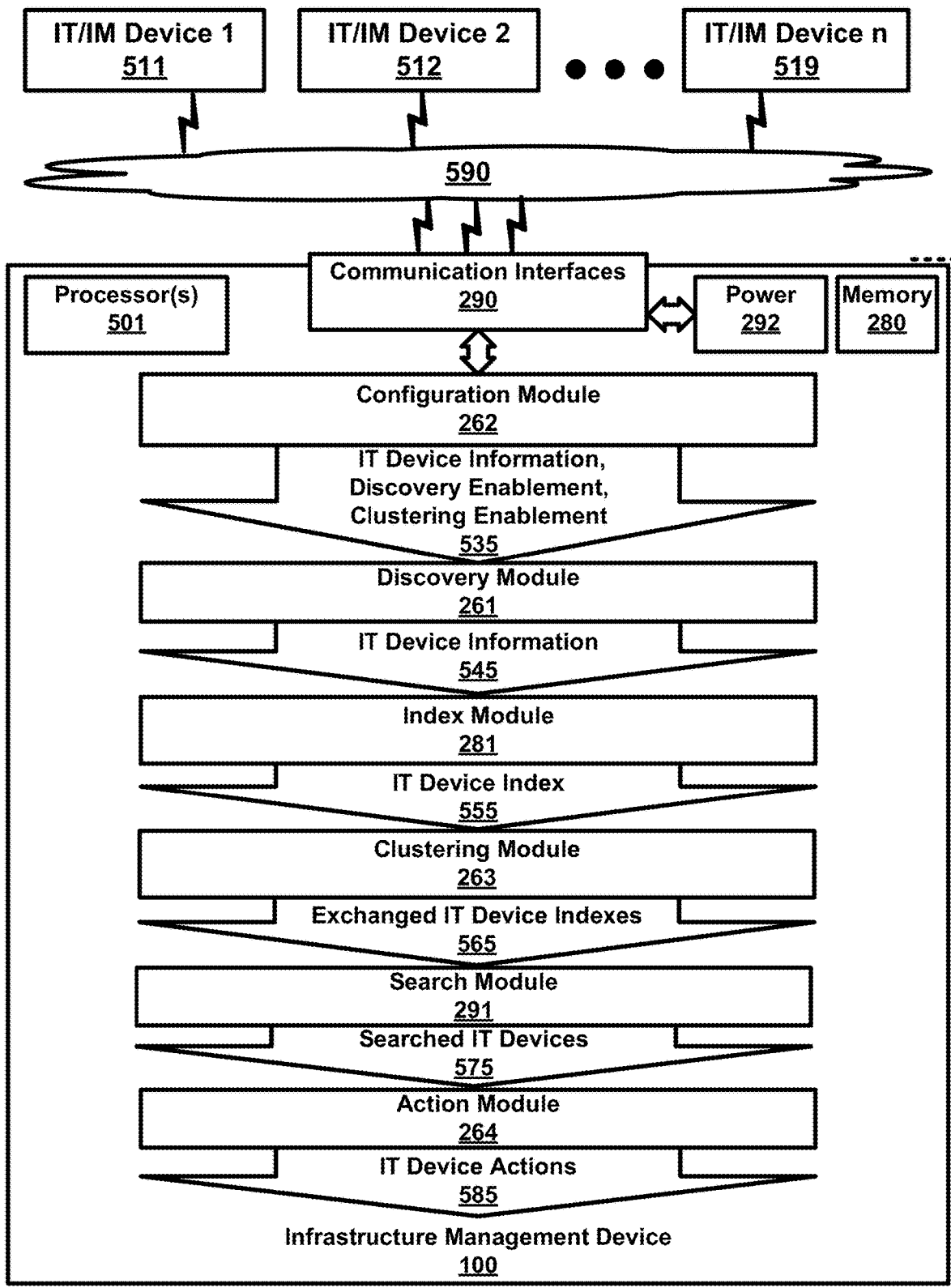
FIG. 5 is a block diagram of an exemplary infrastructure management device.
Figure 6:
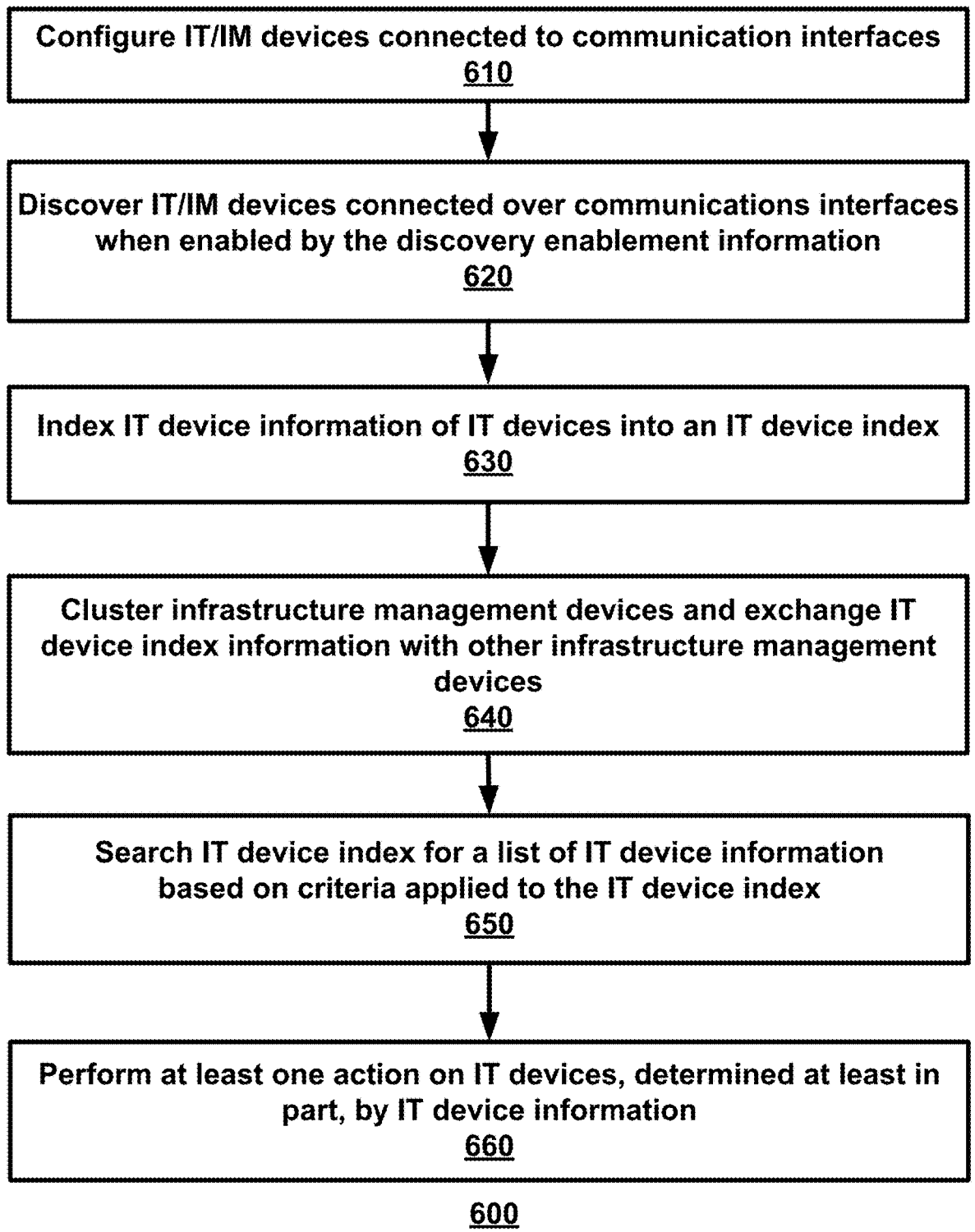
FIG. 6 is a flow diagram illustrating an exemplary method for configuring, discovering, indexing, clustering, and/or taking actions according to some implementations.

FIG. 5 is a block diagram of an exemplary infrastructure management device 100 according to some implementations. FIG. 6 is a flow diagram illustrating an exemplary method 600 for configuring, discovering, indexing, clustering, and/or taking actions according to some implementations. It should be understood that the steps of the method 600 may be performed in the order shown or a different order. Additional, different, or fewer steps may also be provided. Further, the method 600 may be implemented with the device 100 of FIG. 5, a different system, or a combination thereof.

As shown in FIG. 5, the infrastructure management device 100 may include at least one processor 501, a system memory 280, a power unit 292, communication interfaces 290 and other supporting hardware (e.g., electronic communication busses, controllers, non-transitory machine-readable medium readers, combinations thereof, and/or the like). Memory 280 may include one or more tangible non-transitory machine-readable media. Memory 280 may store instructions configured to cause at least one processor 501 to perform a process of configuring, discovering devices when enabled by discovery enablement information, indexing IT device information into an IT device index, clustering the infrastructure management device when enabled by clustering enablement information, exchanging IT device index information with other IM devices being clustered, searching IT device index for IT device information based on a search criterion and performing an action on IT devices, determined at least in part, by the IT device information.

The communication interfaces 290 may be configured to communicate with other IT devices/IM devices (511, 512 . . . 519) over a network 590. The communication interfaces 290 may include at least one of the following: a serial port interface (e.g., RS-232 or RS-485), a Local Area Network (LAN), a Wide Area Network Area (WAN), a Virtual Private Network (VPN), a Wi-Fi wireless Network, a USB port (e.g., type A or type C), a Bluetooth interface, a combination thereof, and/or the like. The communication interfaces 290 may further include a housing which may comprise at least one of the following: a two Rack-Unit (2 U) height mounted horizontally to the rack; a one Rack-Unit (1 U) height mounted horizontally to the rack; a less than one Rack-Unit (<1 U) height mounted horizontally to the rack; and a zero Rack-Unit (0 U) height mounted vertically to the rack, and/or the like.

The network 590 may comprise, but is not limited to: the Internet, an intranet, a connection to the Internet, a private cloud, interconnected data centers, a multi-nodal network, two or more computing devices connected using a Virtual Private Network (VPN), an on premise network, an RS-232 serial network, an RS-485 serial network, a local area network (LAN), a wide area network Area (WAN), a Wi-Fi wireless network, a USB port, a USB port type A, a USB port type C, a Bluetooth, a combination thereof, and/or the like.

The infrastructure management device 100 may comprise multiple infrastructure management devices configured to be cooperatively operated together. Examples of an infrastructure management device 100 may comprise, but are not limited to: a housing, at least one USB port interface, and at least one of the following: a system hardware with network access, a server, a compute node, a router, a switch, a firewall, a load balancer, a networking node, a storage node, a power node, a network appliance, a virtual appliance, a hosted module within a system, a combination thereof, and/or the like. According to some implementations, IT/IM devices (511, 512 . . . 519) may comprise at least one of the following: a server, a compute node, a router, a switch, a firewall, a load balancer, a networking node, a storage node, a power node, a cooling node, a storage appliance, a power appliance, a cooling appliance, a network appliance, a virtual appliance, a virtual machine, system hardware with network access, a hosted module within a system, a laptop, a USB device, a cellular phone, a tablet device, a mobile device, an environmental sensor device, a video or screen or monitor device, and a keyboard device a combination thereof, and/or the like.

At 610 of FIG. 6, IT/IM devices (511, 512 . . . 519) communicatively connected over communication interfaces 290 may be configured. This configuration may be performed by, for example, a configuration module (or engine) 262. The configuration module (or engine) 262 may configure the IT device information, the discovery enablement and clustering enablement 535. The configuration of IT devices information may be performed in numerous ways according to various implementations. For example, an IT device information may be configured by making changes to a universally unique identifier, a virtual machine name, a hypervisor IP address, an alias IP address, a group or community identifier, a port identifier, a port range identifier, a USB port range, a USB identifier, a USB port name, an IT device name, a power status, a power parameter, a power feed, an action, a list of actions, a command, a hostname, an icon, an internet protocol address, a protocol type, a service processor type, a media access control address (MAC address), a hierarchical organization, a connection status, a configuration parameter, a user defined field and value, a map address location, a group of IT device parameters, a group of users' parameters, an IT device access rights parameter, a notification parameter, a data logging parameter, an alert parameters, and IT device initial status, an application information, an application location, an application status, an application icon, an application file, a data store, a keyboard, video and mouse information, a combination thereof, and/or the like. In a second example, discovery enablement may be configured by making changes to a configuration parameter, a multitude of parameters, an action, a multitude of actions, an IT device state, a combination of the above, and/or the like. In a third example, clustering enablement may be configured by making changes to a configuration parameter, a multitude of parameters, an action, a multitude of actions, an IT device state, a combination thereof, and/or the like.

At 620, IT/IM devices (511, 512 . . . 519) communicatively connected over communication interfaces 290 may be discovered when enabled by the discovery enablement information. This discovery may be performed by, for example, a discovery module (or engine) 261. Discovery may define classes of communication methods, protocols and processes used to discover the IT device information 545 of IT devices connected over the communication interfaces. Discovery may also be employed to identify possible mechanisms to interact with IT devices. Discovery may include determining if another IT/IM device (511, 512 . . . 519) operates using a similar protocol. A protocol may be defined by a system of digital rules for exchange of data within or between computers. The rules may define formats for exchanging messages where some messages are configured to elicit a response from a range of possible responses predetermined for that particular situation. A protocol may define the syntax, semantics, and synchronization of communication. Some specified behaviors may be independent of how an interface is implemented. A protocol may be implemented as hardware, software, or both. Some of the various communications protocols may be implemented according to one or more technical standards from organizations such as, but not limited to, the International Organization for Standardization (ISO), the International Telecommunications Union (ITU), the Institute of Electrical and Electronics Engineers (IEEE), and the Internet Engineering Task Force (IETF).

Discovery may further involve determining if another IT/IM device (511, 512 . . . 519) operates using a similar communication profile. Yet other discoveries may include determining if another IT device is the same class of IT device. Additionally, IT device information may be discovered by interacting with at least one IT device connected to the serial port interface, listening to a communication from at least one IT device, listening to a Dynamic Host Configuration Protocol (DHCP) request from at least one IT device, interacting with a communications processor associated with at least one IT device, interacting with a communications processor disposed within at least one IT device, interacting with a virtual machine hypervisor, interacting with a console server, interacting with a terminal server, interacting with an agent, interacting with a Configuration Management Database system, interacting with a data store system, interacting with another infrastructure management device, a combination of the above, and/or the like.

At 630, IT device information of IT devices may be indexed into an IT device index 555. This indexing may be performed by, for example, an index module (or engine) 281. The indexing of IT device information may be performed in numerous ways according to various implementations. For example, indexing may be performed by collecting, processing and/or organizing, periodically, IT device information for the at least one IT device, updating, periodically, the IT device index of the infrastructure management device, a combination thereof, and/or the like. In a second example, indexing may be performed by collecting, processing and/or organizing, periodically, the IT device information for the at least one IT device, updating, periodically, the IT device index of at least one other infrastructure management device, a combination thereof, and/or the like. The result of the indexing may be stored into the IT device index 555. The IT device indexing may be performed by, for example, an in-memory data store, an on-disk data store, a local data store, a remote data store, a distributed data store, a replicated data store, a combination of the above, and/or the like.

At 640, clustering infrastructure management devices and exchanging IT device index information with other infrastructure management devices may be performed. This clustering may be performed by, for example, a clustering module (or engine) 263. The clustering of IM devices may be performed in numerous ways according to various implementations. For example, clustering may be performed by configuring one of the clustered IM devices to name and maintain a list of communicatively connected IM devices, configuring one of the clustered IM devices to define at least one credential for multiple communicatively connected IM devices on at least one named list, configuring one of the clustered IM devices to define at least one Secure Socket Layer (SSL) certificate for the clustered communicatively connected IM devices on at least one named list, configuring one of the clustered IM devices to request a list of the clustered communicatively connected IM devices on the at least one named list, configuring one of the clustered IM devices to periodically interact with at least one of the clustered communicatively connected IM devices on the at least one named list, providing IT device information of the clustered communicatively connected IM devices on the at least one named list, exchanging at least one IT device index of the clustered communicatively connected IM devices on the at least one named list, a combination thereof, and/or the like. As a result of the clustering, the exchanged IT device indices 565 may be available on at least one IM device.

At 650, searching the IT device index for a list of IT device information based on criteria applied to the IT device index may be performed. This searching may be performed by, for example, search module 291. The searching of IT device index may be performed in numerous ways according to various implementations. For example, searching may be performed by conducting a natural language search that returns searched IT devices 575 in a table, a Web page, a hierarchical tree, a graphical node, a geographic map, a command-line (CLI) representation of the search results, a combination thereof, and/or the like. Additionally, a search criterion applied to the IT device index may include a query parameter, a source document index, a source field, a number of matching results to return, a sorting order, a Boolean logic, a filter, a range, a logical condition, an aggregation, a relevance, a combination thereof, and/or the like.

At 660, at least one action selected from multiple possible actions on IT devices may be performed. This action may be determined at least in part, by IT device information, and performed by, for example, an action engine 264. IT device actions 585 may be an operation executed based on the searched IT devices. The IT device actions may be performed in numerous ways according to various implementations. For example, an IT device action may be performed by executing at least one user-defined command, script and/or program on at least one IT device over at least one communication interface, executing at least one user-defined command, script and/or program on at least one of the IT device locally, executing at least one user-defined command, script and/or program on at least one other IM device over the network, executing at least one user-defined command, script and/or program on the infrastructure management device locally, performing a connection (e.g., serial console, serial virtual machine console, screen-cast, mirroring, IT device access, mapped file system, console shell, video, file transfer) over at least one communication interface, performing an application installation and/or removal over at least one communication interface, performing a software upgrade procedure over at least one communication interface, performing a configuration save and/or restore over at least one communication interface, performing a reboot over at least one communication interface, performing a Keyboard-Video-Mouse (KVM) console connection over at least one communication interface, performing a Mouse-Keyboard-Screen (MKS) virtual machine console connection over at least one communication interface, performing a power command on at least one IT device over at least one communication interface, establishing a TCI/IP tunnel between the user's workstation and the infrastructure management device, performing access rights control on commands, performing data log collection on an IT device data session, performing alert and notification based on configuration and data log collection from at least one of the at least one IT device, performing data points collection on an IT device, performing data monitoring collection on an IT device, performing alert and notification based on configuration and data log collection, performing authentication and authorization to a user based on at least one of the following: command, user group and IT device, a combination of the above, and/or the like. In a second example, an IT device actions may be performed by communicating with at least one IT device in order to verify an IT device state, cause a change in the IT device state, a combination thereof, and/or the like. For further clarification, an IT device state may be, for example, an IT device power state, an IT device console session state, an IT device login credential state, an IT device configuration state, an IT device Operating System (OS) state, an IT device firmware state, an IT device hosted application state, an IT device file transfer state, an IT device video recording state, a combination thereof, and/or the like.

In some implementations, the IT device action is performed during development of a software application (e.g., App) that is to be executed on the IT device. The IT device action may be performed by, for example, action engine 264, and includes, but is not limited to, debugging the software application, updating the software application, testing the software application, or a combination thereof. Test logs of test results may be generated and stored in, for example, non-volatile memory 280. Different versions of the software application may also be managed and stored in, for example, non-volatile memory 280. During the software development, power delivery to the IT device may be controlled to, for example, optimize the battery life of the IT device and prevent damage due to exposure to extended charging.

In other implementations, the IT device action is performed during the production of the IT device. The IT device action may be performed by, for example, action engine 264, and includes, but is not limited to, performing initial configuration of the IT device, collecting test logs, or a combination thereof.

Figure 7:
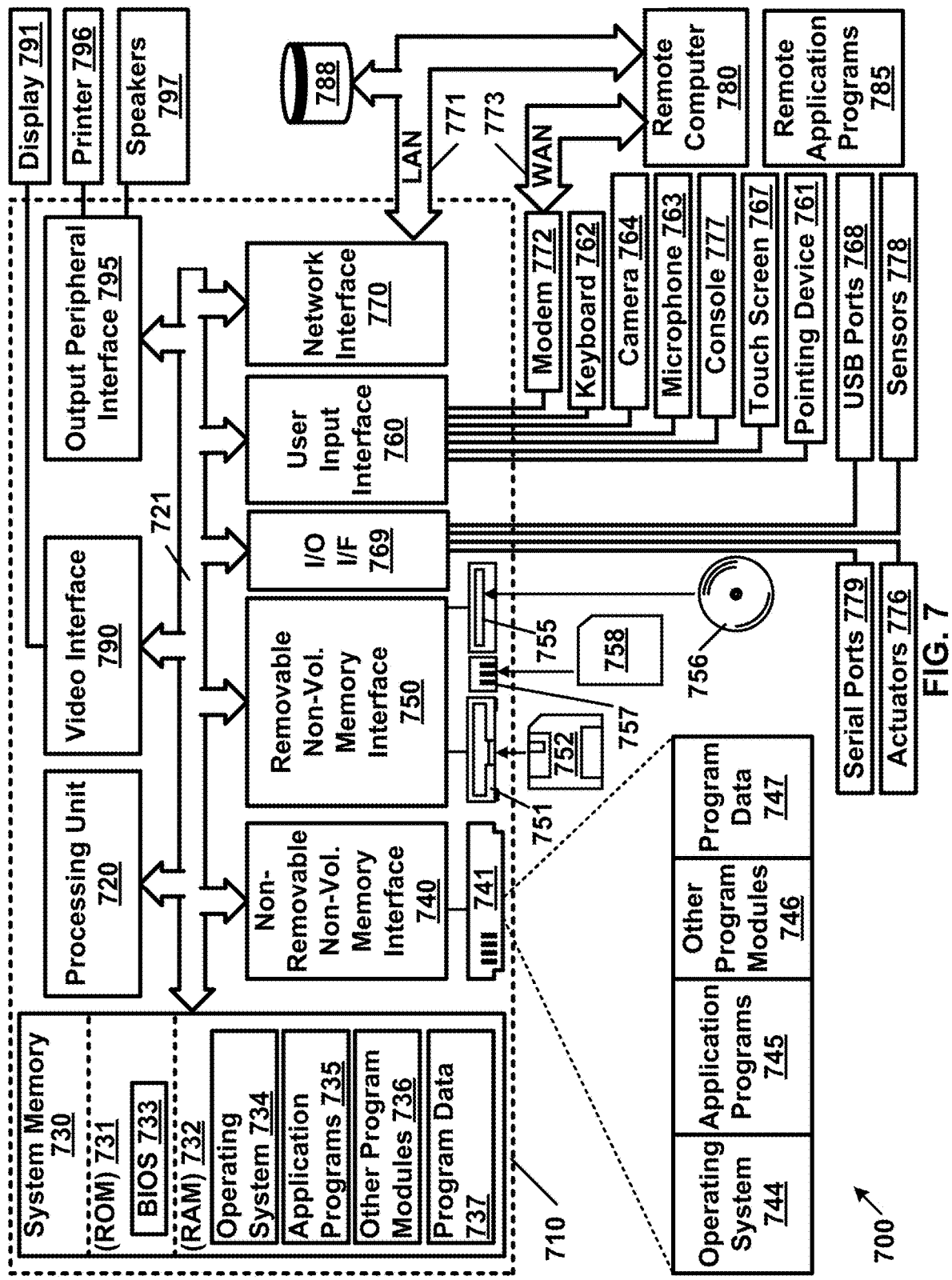
FIG. 7 illustrates an exemplary computing system environment on which aspects of some implementations may be implemented.

FIG. 7 illustrates an exemplary computing system environment 700 on which aspects of some implementations may be implemented. The computing system environment 700 is only one example of a suitable computing environment and is not intended to suggest any limitation as to the scope of use or functionality of the claimed subject matter. Neither should the computing environment 700 be interpreted as having any dependency or requirement relating to any one or combination of components illustrated in the exemplary operating environment 700.

Implementations of the present invention are operational with numerous other general purpose or special purpose computing system environments or configurations. Examples of well-known computing systems, environments, and/or configurations that may be suitable for use with various implementations include, but are not limited to, embedded computing systems, personal computers, server computers, hand-held or laptop devices, multiprocessor systems, microprocessor-based systems, set top boxes, programmable consumer electronics, network PCs, minicomputers, mainframe computers, cloud services, telephony systems, distributed computing environments that include any of the above systems or devices, and the like.

Implementations may be described in the general context of computer-executable instructions, such as program modules, being executed by computing capable devices. Generally, program modules include routines, programs, objects, components, data structures, etc. that perform particular tasks or implement particular abstract data types. Some implementations may be designed to be practiced in distributed computing environments where tasks are performed by remote processing devices that are linked through a communications network. In a distributed computing environment, program modules may be located in both local and remote computer storage media including memory storage devices.

As shown in FIG. 7, the system includes a computing device 710. Components of computer 710 may include, but are not limited to, a processing unit 720, a system memory 730, and a system bus 721 that couples various system components including the system memory 730 to the processing unit 720.

Computer 710 typically includes a variety of computer-readable media. Computer-readable media can be any available media that can be accessed by computer 710 and includes both volatile and non-volatile media, and removable and non-removable media. By way of example, and not limitation, computer-readable media may comprise computer storage media and communication media. Computer storage media includes both volatile and non-volatile, and removable and non-removable media implemented in any method or technology for storage of information such as computer-readable instructions, data structures, program modules or other data. Computer storage media includes, but is not limited to, random access memory (RAM), read-only memory (ROM), electrically erasable programmable read-only memory (EEPROM), flash memory or other memory technology, compact disc read-only memory (CD-ROM), digital versatile disks (DVD) or other optical disk storage, magnetic cassettes, magnetic tape, magnetic disk storage or other magnetic storage devices, or any other medium which can be used to store the desired information and which can be accessed by computer 710. Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency (RF), infrared and other wireless media. Combinations of any of the above computer-readable media may also be useful.

The system memory 730 includes computer storage media in the form of volatile and/or non-volatile memory such as ROM 731 and RAM 732. A basic input/output system (BIOS) 733, containing the basic routines that help to transfer information between elements within computer 710, such as during start-up, is typically stored in ROM 731. RAM 732 typically contains data and/or program modules that are immediately accessible to and/or presently being operated on by a processing unit 720. By way of example, and not limitation, FIG. 7 illustrates a RAM 732 including operating system 734, application programs 735, other program modules 736, and program data 737.

The computer 710 may also include other removable/non-removable volatile/non-volatile computer storage media. By way of example only, FIG. 7 illustrates a hard disk drive 741 that reads from or writes to non-removable, non-volatile magnetic media, a magnetic disk drive 751 that reads from or writes to a removable, non-volatile magnetic disk 752, a flash drive reader 757 that reads flash drive 758, and an optical disk drive 755 that reads from or writes to a removable, non-volatile optical disk 756 such as a CD ROM or other optical media. Other removable/non-removable, volatile/non-volatile computer storage media that can be used in the exemplary operating environment include, but are not limited to, magnetic tape cassettes, flash memory cards, digital versatile disks, digital video tape, solid state RAM, solid state ROM, and the like. The hard disk drive 741 is typically connected to the system bus 721 through a non-removable memory interface such as interface 740, and magnetic disk drive 751 and optical disk drive 755 are typically connected to the system bus 721 by a removable memory interface, such as an interface 750.

The drives and their associated computer storage media discussed above and illustrated in FIG. 7 provide storage of computer-readable instructions, data structures, program modules and other data for the computer 710. In FIG. 7, for example, the hard disk drive 741 is illustrated as storing operating system 744, application programs 745, other program modules 746, and program data 747. Additionally, for example, the non-volatile memory may include instructions to, for example, discover and configure IT devices, the creation of device neutral user interface commands, combinations thereof, and/or the like.

A user may enter commands and information into the computer 710 through input devices such as a keyboard 762, a microphone 763, a camera 764, a touch screen 767, a console 777 and a pointing device 761, such as a mouse, trackball or touch pad. These and other input devices are often connected to the processing unit 720 through a user input interface 760 that is coupled to the system bus 721, but may be connected by other interfaces and bus structures, such as a parallel port, game port or a universal serial bus (USB). A monitor 791 or other types of display device may also connect to the system bus 721 via an interface, such as a video interface 790. Other devices, such as, for example, speakers 797 and printer 796 may be connected to the system via peripheral interface 795.

The computer 710 may also include other input/output devices such as serial ports 779, USB ports 768, sensors 778 and actuators 776 that may be used to interact with IT devices. These and other input/output devices are often connected to the processing unit 720 through an Input/Output Interface (I/O I/F) 769 coupled to the system bus 721, but may also be connected by other interfaces and bus structures. Examples of the serial communication interfaces may comprise, but are not limited to, RS-232 serial ports, and RS-485 serial ports. Serial ports 779 may be implemented in many physical formats, such as, for example, DB9, DB25, RJ11, RJ45, and twisted pair (like RS-422).

The computer 710 may be operated in a networked environment using logical connections to one or more remote computers, such as a remote computer 780. The remote computer 780 may be a personal computer, a handheld device, a server, a router, a network PC, a peer device or other common network node, and typically includes many or all of the elements described above relative to the computer 710. The logical connections depicted in FIG. 7 include a local area network (LAN) 771 and a wide area network (WAN) 773, but may also include other networks. Such networking environments are commonplace in offices, enterprise-wide computer networks, intranets and the Internet.

When used in a LAN networking environment, the computer 710 is connected to the LAN 771 through a network interface or adapter 770. When used in a WAN networking environment, the computer 710 typically includes a modem 772 or other means for establishing communications over the WAN 773, such as the Internet. The modem 772, which may be internal or external, may be connected to the system bus 721 via the user input interface 760, or other appropriate mechanism. The modem 772 may be wired or wireless. Examples of wireless devices may comprise, but are not limited to, Wi-Fi and Bluetooth. In a networked environment, program modules depicted relative to the computer 710, or portions thereof, may be stored in the remote memory storage device. By way of example, and not limitation, FIG. 7 illustrates remote application programs 785 as residing on a remote computer 780. It will be appreciated that the network connections shown are exemplary and other means of establishing a communications link between the computers may be used. Additionally, for example, LAN 771 and WAN 773 may provide a network interface to communicate with other distributed infrastructure management devices, with IT devices (e.g., network disk drive 788), with users remotely accessing the User Input Interface 760, Input/Output Interface 769, combinations thereof, and/or the like.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

In this specification, "a" and "an" and similar phrases are to be interpreted as "at least one" and "one or more". References to "an" implementation in this disclosure are not necessarily to the same implementation.

Many of the elements described in the disclosed implementations may be implemented as modules. A module is defined here as an isolatable element that performs a defined function and has a defined interface to other elements. The modules described in this disclosure may be implemented in hardware, a combination of hardware and software, firmware, wetware (i.e., hardware with a biological element) or a combination thereof, all of which are behaviorally equivalent. For example, modules may be implemented using computer hardware in combination with software routines written in a computer language (Java, HTML, XML, PHP, Python, ActionScript, JavaScript, Ruby, Prolog, SQL, VBScript, Visual Basic, Perl, C, C++, Objective-C or the like). Additionally, it may be possible to implement modules using physical hardware that incorporates discrete or programmable analog, digital and/or quantum hardware. Examples of programmable hardware include: computers, microcontrollers, microprocessors, application-specific integrated circuits (ASICs), field programmable gate arrays (FPGAs), and complex programmable logic devices (CPLDs). Computers, microcontrollers and microprocessors are programmed using languages such as assembly, C, C++ or the like. FPGAs, ASICs and CPLDs are often programmed using hardware description languages (HDL) such as very high speed integrated circuit (VHSIC) hardware description language (VHDL) or Verilog that configure connections between internal hardware modules with lesser functionality on a programmable device. Finally, it needs to be emphasized that the above-mentioned technologies may be used in combination to achieve the result of a functional module.

Some implementations may employ processing hardware. Processing hardware may include one or more processors, computer equipment, embedded systems, machines a combination thereof, and/or the like. The processing hardware may be configured to execute instructions. The instructions may be stored on a machine-readable medium. According to some implementations, the machine-readable medium (e.g., automated data medium) may be a medium configured to store data in a machine-readable format that may be accessed by an automated sensing device. Examples of machine-readable media include: magnetic disks, cards, tapes, and drums, flash memory, memory cards, electrically erasable programmable read-only memory (EEPROM), solid state drives, optical disks, barcodes, magnetic ink characters, a combination thereof, and/or the like.

While various implementations have been described above, it should be understood that they have been presented by way of example, and not limitation. It will be apparent to persons skilled in the relevant arts that various changes in form and detail can be made therein without departing from the spirit and scope. In fact, after reading the above description, it will be apparent to one skilled in the relevant arts how to implement alternative implementations. Thus, the present implementations should not be limited by any of the above-described exemplary implementations. In particular, it should be noted that, for examplary purposes, the presently described implementations are discussed with respect to a data center. However, one skilled in the art will recognize that implementations may be employed to other collections of IT devices over, for example, a distributed network not confined by a single data center, a small collection of IT devices in an Intranet, combinations thereof, and/or the like.

In addition, it should be understood that any figures that highlight any functionality and/or advantages are presented for example purposes only. The disclosed architecture is sufficiently flexible and configurable, such that it may be utilized in ways other than that shown. For example, the steps listed in any flowchart may be re-ordered or only optionally used in some implementations.

What is claimed is:

1. An infrastructure management device, comprising:
a) wired communication interfaces configured to
connect to information technology (IT) devices,
provide power to the IT devices connected thereto, wherein providing power comprises providing power over a Universal Serial Bus (USB) interface, providing switchable ON/OFF power over the USB interface, metering power over the USB interface, providing power over an ETHERNET interface, providing switchable ON/OFF power over the ETHERNET interface, and metering power over the ETHERNET interface, and
to connect and communicate with at least one other infrastructure management device having wired communication interfaces configured to connect to IT devices, provide power to IT devices connected thereto and to connect and communicate with other infrastructure management devices;
b) one or more processors; and
c) one or more non-transitory machine-readable media comprising instructions configured to cause at least one of the one or more processors of the infrastructure management device to perform operations to manage the IT device, wherein the operations include
performing at least one action on a selected IT device of the IT devices connected to the communication interfaces by the one or more processors of the infrastructure management device, wherein the at least one action is determined at least in part by IT device information of the selected IT device in an IT device index stored in the infrastructure management device, wherein the at least one action comprises
performing software development of a software application on the selected IT device, wherein the software development includes debugging or testing the software application, and
monitoring and controlling power delivery to the selected IT device via the communication interface to which the selected IT device is connected to avoid damage to batteries of the selected IT device during the software development.

2. The device of claim 1, further comprises a housing configured to enclose at least
the wired communication interfaces,
the one or more processors, and
the one or more non-transitory machine-readable media.

3. The device of claim 2, wherein the housing comprises a two Rack-Unit (2 U) height while the housing is mounted horizontally to a rack.

4. The device of claim 2, wherein the housing comprises a one Rack-Unit (1 U) height while the housing is mounted horizontally to a rack.

5. The device of claim 2, wherein the housing comprises less than one Rack-Unit (<1 U) height while the housing is mounted horizontally to a rack.

6. The device of claim 2, wherein the housing comprises a zero Rack-Unit (0 U) height while the housing is mounted vertically to a rack.

7. The device of claim 1 wherein the one or more non-transitory machine-readable media comprising instructions configured to cause at least one of the one or more processors to further discover the IT devices,
index the IT device information of the IT devices into a device index, and
search the device index for the IT device information based on a search criterion.

8. The device of claim 1 wherein the one or more non-transitory machine-readable media comprising instructions configured to cause at least one of the one or more processors to further control power delivery to the IT devices by full hardware reboot, cold reboot, warm reboot, or a combination thereof.

9. The device of claim 1 wherein the one or more non-transitory machine-readable media comprising instructions configured to cause at least one of the one or more processors to further control power delivery to the one or more IT devices by maintaining a predetermined charge level on the one or more IT devices to optimize battery life.

10. The device of claim 1 wherein the one or more non-transitory machine-readable media comprising instructions configured to cause at least one of the one or more processors to perform a power command on one or more IT devices over the wired communication interfaces, wherein the power command comprises executing "power off" or "power reboot" on the one or more IT devices.

11. An infrastructure management method, comprising:
configuring, via an infrastructure management device with wired communication interfaces, IT devices connected to the wired communication interfaces of the infrastructure management device, wherein
the communication interfaces are configured to
provide power to the IT devices connected thereto, wherein providing power comprises providing power over a Universal Serial Bus (USB) interface, providing switchable ON/OFF power over the USB interface, metering power over the USB interface, providing power over an ETHERNET interface, providing switchable ON/OFF power over the ETHERNET interface, and metering power over the ETHERNET interface, and
connect and communicate with at least one other infrastructure management device having wired communication interfaces configured to connect to IT devices, provide power to IT devices connected thereto and to connect and communicate with other infrastructure management devices;
discovering the IT devices connected to the communication interfaces of the infrastructure management device;
indexing IT device information of the IT devices into a device index stored in the infrastructure management device;
clustering the infrastructure management device with a second infrastructure management device connected to one of the communication interfaces of the infrastructure management device;
searching the device index for the IT device information based on a search criterion; and
performing at least one action by the infrastructure management device on a selected IT device of the IT devices connected to the communication interfaces of the infrastructure management device, wherein the at least one action is determined at least in part by IT device information of the selected IT device in the device index, and wherein the at least one action performed by the infrastructure device comprises performing software development of a software application on the selected IT device, wherein the software development includes debugging or testing a software application on the at least one IT device by the infrastructure management device, and
monitoring and controlling power delivery to the selected IT device via the communication interface to which the selected IT device is connected to avoid damage to batteries of the selected IT device during the software development on the selected IT device.

12. The method of claim 11 wherein configuring the IT devices comprises configuring at least one of the following:
the IT device information,
discovery enablement information, and
clustering enablement information.

13. The method of claim 11 wherein discovering the IT devices comprises determining if another IT device or another infrastructure management device operates using a protocol or communication profile that is used by the infrastructure management device or one or more of the IT devices.

14. The method of claim 11 wherein clustering the infrastructure management device with the second infrastructure management device comprises exchanging the device index with the second clustered infrastructure management device.

15. The method of claim 11 wherein clustering the infrastructure management device with the second infrastructure management device comprises maintaining a list of clustered infrastructure management devices, and configuring one of the clustered infrastructure management devices to define at least one credential for the infrastructure management devices on the list.

16. The method of claim 11 wherein performing the at least one action comprises managing and storing different versions of the software application.

17. The method of claim 11 wherein performing the at least one action comprises controlling power delivery to the selected IT device by maintaining a partial charge level on the selected IT device to optimize battery life.

18. The method of claim 11 wherein performing the at least one action comprises generating and storing logs of test results from testing the software application.

19. One or more non-transitory tangible machine-readable media comprising instructions configured to cause at least one processor to perform operations comprising:
discovering IT devices connected to wired communication interfaces of an infrastructure management device, wherein
the wired communication interfaces are configured to
provide power to the IT devices connected thereto, wherein providing power comprises providing power over a Universal Serial Bus (USB) interface, providing switchable ON/OFF power over the USB interface, metering power over the USB interface, providing power over an ETHERNET interface, providing switchable ON/OFF power over the ETHERNET interface, and metering power over the ETHERNET interface, and
connect and communicate with at least one other infrastructure management device having wired communication interfaces configured to connect to IT devices, provide power to IT devices connected thereto and to connect and communicate with other infrastructure management devices;
indexing device information of the IT devices into a device index stored in the infrastructure management device;
clustering the infrastructure management device with a second infrastructure management device connected to one of the communication interfaces of the infrastructure management device, including exchanging the device index with the the second infrastructure management device being clustered;

searching the device index for the device information based on a search criterion; and performing at least one action on a selected IT device of the IT devices which is determined at least in part by the device information of the selected IT device in the device index stored in the information management device, wherein the at least one action comprises performing software development of a software application on the selected IT device, wherein the software development includes debugging or testing the software application, and monitoring and controlling power delivery to the selected IT device via the communication interface to which the selected IT device is connected to avoid damage to batteries of the selected IT device during the software development on the selected IT device.

* * * * *